United States Patent [19]

Maltiel

[11] 4,432,008
[45] Feb. 14, 1984

[54] GOLD-DOPED IC RESISTOR REGION

[75] Inventor: Ron Maltiel, Stanford, Calif.

[73] Assignee: The Board of Trustees of the Leland Stanford Junior University, Stanford, Calif.

[21] Appl. No.: 170,562

[22] Filed: Jul. 21, 1980

[51] Int. Cl.³ .................... H01L 27/04; H01L 29/167
[52] U.S. Cl. ...................................... 357/51; 357/41; 357/64
[58] Field of Search ................... 357/64, 51, 41, 23 R

[56] References Cited

U.S. PATENT DOCUMENTS

| | | | |
|---|---|---|---|
| 3,286,138 | 11/1966 | Shockley | 357/51 |
| 3,341,754 | 9/1967 | Kellett et al. | 357/51 |
| 3,484,658 | 12/1969 | Komatsu | 357/51 |
| 3,504,239 | 3/1970 | Johnson et al. | 357/51 |
| 3,683,306 | 8/1972 | Bulthuis et al. | 357/51 |
| 3,796,929 | 3/1974 | Nicholas et al. | 357/51 |
| 4,063,210 | 12/1977 | Collver | 357/59 |
| 4,323,913 | 4/1982 | Murrmann et al. | 357/51 |
| 4,326,213 | 4/1982 | Shirai et al. | 357/51 |

OTHER PUBLICATIONS

Applied Physics, vol. 10, pp. 181–185, 1976, Runge et al.
Whight et al., Solid State Electronics, vol. 19, pp. 1021–1027, 1976.
Ku, Solid State Electronics, vol. 20, pp. 803–812, 1977.

Primary Examiner—William D. Larkins
Attorney, Agent, or Firm—Flehr, Hohbach, Test, Albritton & Herbert

[57] ABSTRACT

Resistive elements of semiconductor devices and integrated circuits are reduced in size thereby allowing larger scale integration. Deep level dopants including impurities or crystalline lattice defects, or both, are formed in a low resistance doped region thereby increasing the resistance of a portion of the doped region. Resistive contacts and interconnects require less semiconductor surface area.

1 Claim, 8 Drawing Figures

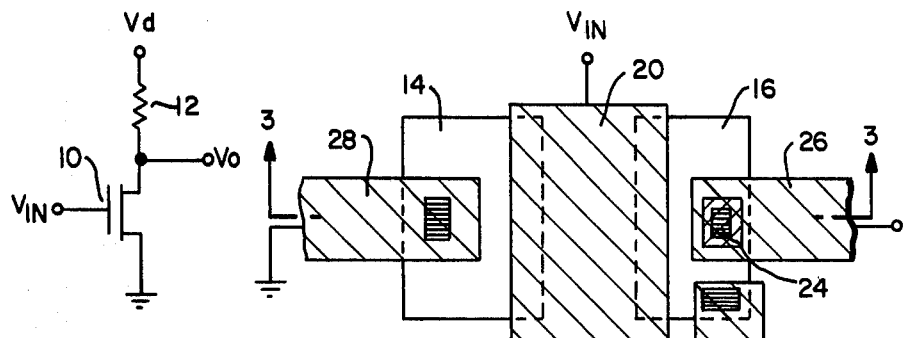
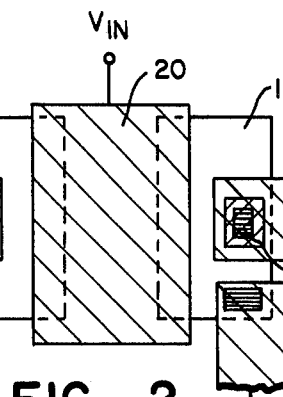
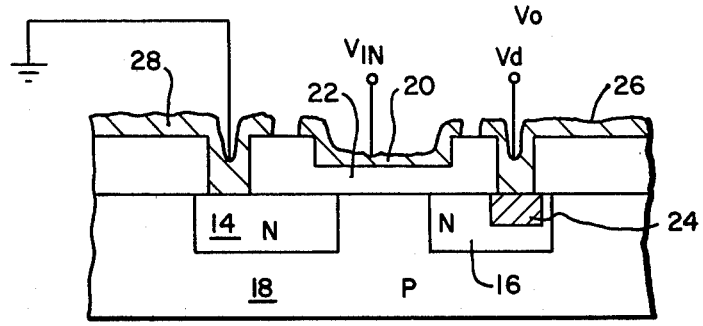
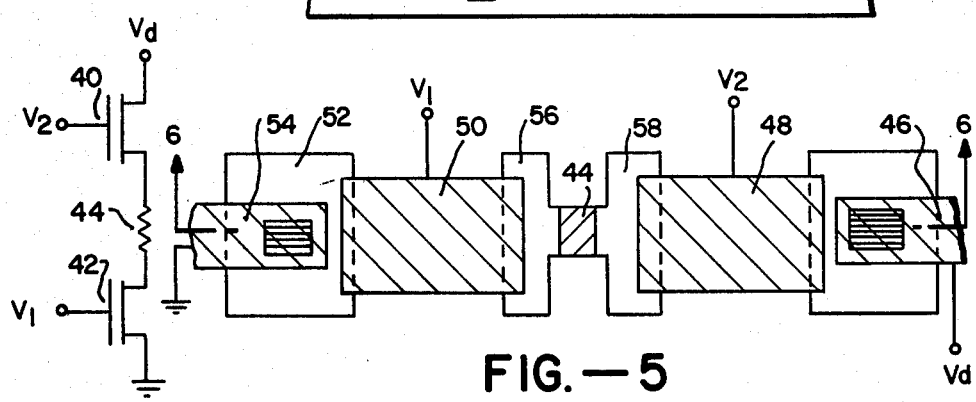
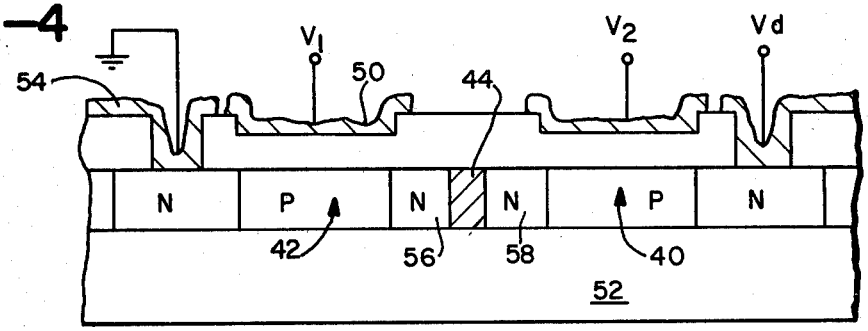

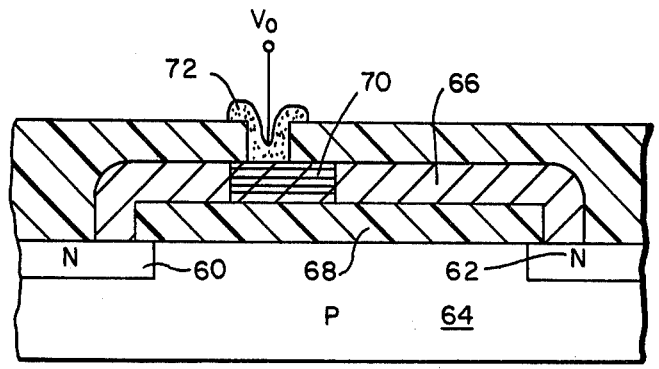
FIG.—7
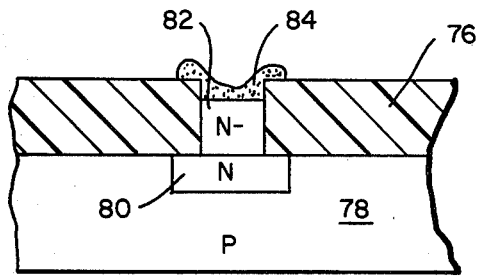
FIG.—8
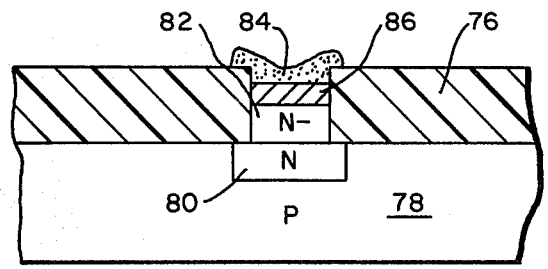
FIG.—9

GOLD-DOPED IC RESISTOR REGION

This invention relates generally to semiconductor devices and technology, and more particularly the invention relates to a method and means for resistively contacting and interconnecting semiconductor devices.

Modern electrical circuits are typically embodied in monolithic semiconductor integrated circuits. With large scale integration (LSI) and very large scale integration (VLSI) fabrication techniques, the size of active circuit components has decreased and the complexity of the integrated circuits has increased. However, passive devices such as resistors still require substantial surface area and thus limit the further reduction in circuit size. Typically, such resistors comprise surface layers such as doped polycrystalline silicon or diffused regions within the semiconductor body with the resistance value determined by surface configuration and dopant concentration. Not only do the diffused resistors and resistive layers require substantial surface area, but these resistors also introduce parasitic capacitance which increases as the resistor interface area increases. Thus, conventional resistors not only limit device circuit size but can also adversely affect circuit performance by the introduction of the parasitic capacitance.

An object of the present invention is a new and improved method of fabricating resistive contacts and interconections in semiconductor devices.

Another object of the invention is a resistive contact and a resistive interconnection which have reduced size.

Another object of the invention is a method and means for further reducing the size of semiconductor integrated circuits.

Briefly, in accordance with the present invention deep level impurites, including dopants and/or structural defects, are introduced in a region of the semiconductor body to thereby increase the resistance of the semiconductor material. Semiconductor devices are fabricated by selectively introducing electron donors or N type dopants into semiconductor material and by selectively introducing electron acceptors or P type dopants into the semiconductor material. The undoped semiconductor material, single crystalline silicon for example, exhibits an energy structure having valance electrons energy level and conduction electrons energy level with the two levels being separated by a finite electron energy gap. The shallow p type dopants and N type dopants introduce electron energy levels which lie in the energy gap but are positioned near the valance energy band or conduction energy band, respectively, of the semiconductor material. Thus, the shallow P type dopant will readily accommodate electrons from the semiconductor valance band, and the shallow N type dopant readily provides electrons to the conduction band of the semiconductor material. Deep level impurities, however, exhibit an energy level more nearly placed intermediate the conduction and valance bands of the semiconductor material, and the deep level impurities can function as traps for current carriers, either holes or electrons.

In accordance with the invention, in forming a resistive contact to a region abutting the surface of a semiconductor material, deep level impurities are established in a second region within the first region, the second region abutting the surface of the semiconductor material. An electrically conductive material is then formed on the surface of the semiconductor body which contacts only the second region. Thus, the second region provides a resistance between the electrical contact and the first region.

In inteconnecting semiconductor devices in an integrated circuit, in accordance with the invention, a first doped region is provided which interconnects the two devices. Deep level impurities are then introduced into a portion of the first region thereby increasing the effective resistance of the first region between the two devices. Thus, a low resistance interconnect can be tailored to a higher resistive value without the necessity for a large area resistive region in the interconnect.

The invention and objects and features thereof will be more readily apparent from the following detailed description and appended claims when taken with the drawing, in which:

FIG. 1 is a schematic of a simple electrical circuit.

FIG. 2 is a plan view of the semiconductor integrated circuit shown schematically in FIG. 1 in accordance with one embodiment of the present invention.

FIG. 3 is a section view of the device of FIG. 2 taken along the line 33.

FIG. 4 is a schematic of another electrical circuit including a resistive interconect.

FIG. 5 is a plan view of an integrated circuit illustrated schematically in FIG. 4 and including a resistive interconnect in accordance with another embodiment of the present invention.

FIG. 6 is a section view of the integrated circuit of FIG. 5 taken along the line 66.

FIG. 7 is a section view of an alternative integrated circuit structure including a resistive interconnect in accordance with another embodiment of the invention.

FIGS. 8 and 9 are section views of other resistive contacts in accordance with the invention.

Referring now to the drawings, FIG. 1 is a schematic of a simple circuit including a field effect transistor 10 with an input terminal, $V_{in}$, connected to the gate electrode and an output terminal, $V_o$, connected to the drain of the transistor. A resistor 12 is serially connected from the voltage, $V_D$, to the drain of the transistor, and the source electrode is grounded.

Conventionally, the transistor 10 will be fabricated in the surface of a semiconductor body with the resistor 12 comprising an MOS device or a resistive layer such as doped polycrystalline silicon on the surface of the semiconductor body or comprising a diffused region within the surface of the semiconductor body. As above described, such conventional resistors require substantial surface area and thus limit the size reduction of complex circuit.

FIG. 2 is a plan view of a integrated circuit shown schematically at FIG. 1 having a resistor in accordance with the present invention, the FIG. 3 is a section view of the integrated circuit taken along the line 33 of FIG. 2. Assuming that transistor 10 is an N channel enhancement mode device, the source and drain regions of the field effect transistor comprise N-type doped regions 14 and 16 in a P type semiconductor body 18. The channel region of the transistor between the source and drain regions 14 and 16 is controlled by a gate electrode 20 formed on a silicon oxide layer 22 overlying the channel region.

In accordance with the present invention the voltage $V_d$ is connected to the drain region 16 through a resistive region 24 formed within the drain region 16. Region 24 is defined by deep level impurities which are introduced into region 24 after formation of the drain region 16 by the introduction of elemental atoms of deep level dopants, by the introduction of lattice defects or imperfections in the crystalline structure of the semiconductor material, or by combinations of dopants and defects in the region 24. Deep level dopants for silicon semiconductor material include gold, silver, zinc, and copper. For III-V semiconductor materials such as gallium arsenide, deep level dopants include iron, nickel, and chronium.

In forming the resistive region in a silicon structure, after the formation of the source and drain regions 14 and 16, conventional silicon oxide masking and photolithographic definition and chemical etching techniques are employed to evaporate a thin layer (e.g. 400 angstroms) of gold on the surface of the drain region 16 where region 24 is desired. After depositing the gold, gold is diffused into the region 16 by heating the semiconductor body for a limited period of time at a temperature for the desired diffusion depth. The excess gold on the surface is removed by etching.

Thereafter, a conductive material such as aluminum 26 is formed on with the surface of region 24 whereby the region 24 provides a resistive path between the contact 26 and the drain region 16. The metallization 26 can be formed in the same process step for forming the gate metallization 20 and the source metallization 28.

The resulting resistor, being wholly confined within the drain region 16, reduces the size of the circuit whereby the minimum size is limited only by the definition of the transistor structure and not by an external layer formed on the surface of the semiconductor body or by diffused region in the surface of the semiconductor body. As above noted, other deep level dopants such as silver might be utilized in practicing the invention with silicon material. The amount of deep level dopant used and the thermal processing to diffuse the deep level dopant into the semiconductor body depends on the particular element chosen. Care must be taken that the deep level impurity does not diffuse out of the confined area for the desired resistor. For example, the temperature processing for gold diffusion should occur at a temperature on the order of 900° C. Alternatively, ion implantation can be used to introduce the deep level dopants.

In an alternative process, the resistive region 24 can be formed by introducing lattice defects in the semiconductor material in the region 24. This may be accomplished by implanting ions in the region as ion implantation causes lattice defects which normally are minimized by subsequent thermal annealing. In practicing the invention silicon ions will be introduced into the region 24 at an appropriate ion implantation energy to limit the ion penetration as shown. Thereafter, limited thermal annealing may be employed whereby the lattice defects from the ion implantation remain and consequently increase the resistance of the region 24. Alternatively, other radiation such as laser beam, electron beam or neutron irradiation can be employed for introducing the lattice defects.

The invention can be advantageously employed in the interconnection of devices in a semiconductor integrated circuit. FIG. 4 is a schematic of two field effect transistors 40 and 42 which are serially connected by a resistor 44. FIG. 5 is a plan view of a silicon on sapphire semiconductor integrated circuit in accordance with the schematic of FIG. 4 and embodying the invention, and FIG. 6 is a section view of the integrated circuit taken along the line 6—6 in FIG. 5. In this embodiment the field effect transistors are N channel enhancement mode devices having N-type source and drain regions formed on the sapphire substrate 52. The voltage $V_D$ is connected to the drain region of transistor 40 through metal contact 46, voltage V2 is applied to the gate electrode 48 of the transistor 40, and the voltage $V_1$ is applied to the gate 50 of transistor 42. The source 52 of transistor 42 is connected to ground through contact 54. The drain 56 of transistor 42 and the source 58 of transistor 40 are formed from an N diffused region, as shown.

In accordance with the present invention the resistor 44 is formed in the N diffused region by establishing deep level impurities in the N diffused region between the regions 56 and 58. Thus, the resistor 44 is formed entirely within the transistor structures without the need for additinal surface area or resistive layers on the surface of the semiconductor body. Again, the deep level impurities can be introduced by suitable diffusion or implantation of atoms into the N region, or alternatively the latice structure of the N diffused region can be disrupted by ion implantation or irradiatin beam. The processing is compatible with conventional semiconductor processes in fabricating integrated circuits using diffusion and ion implantation techniques, and the resistive value is readily controlled by the concentration of deep level impurities or the extent of the lattice defects.

FIG. 7 is a section view of another embodiment of an interconnection of two regions 60, 62 in a semiconductor substrate 64 in which the interconnection comprises doped semiconductor material 66 overlying a silicon oxide layer 68. An intermediae portion 70 of the material 66 includes deep level impurities to increase the resistance thereof. A contact 72 is made to the portion 70 whereby the contact 72 is resistively connected to region 60 and to region 62. By adjusting the placement of the contact 72 on the surface of portion 70, the resistive values to each of the regions 60, 62 can be selectively altered.

FIGS. 8 and 9 are section views of resistive contacts in accordance with other embodiments of the invention. In FIG. 8, a silicon oxide layer 76 overlies a substrate 78 and doped region 80 therein. Semiconductor material 82 above the region 80 is resistive semiconductor material such as epitaxial material, polycrystalline material, or amorphous material. A contact 84 of aluminum or like conductive material is formed on the surface of material 82.

To provide a higher resistance value deep level impurities are introduced in a portion 86 of the resistive semiconductor material 82, as illustrated in FIG. 9.

Electrical contacts and resistive interconnects employing deep level impurities in accordance with the present invention reduce the size of semiconductor structures. As used herein and in the claims, the deep level impurities include dopants, lattice imperfections and defects, and combinations thereof.

While the invention has been described with reference to specific embodiments, the description is illustrative of the invention and is not to be construed as limiting the invention. Various modifications and applications will occur to those skilled in the art without departing from the true spirit and scope of the invention as defined by the appended claims.

What is claimed is:

1. An integrated semiconductor field effect transistor and resistor comprising a semiconductor body having a major surface, a first doped source region and a second doped drain region formed in said body and abutting said surface, said first region being spaced from said second region, a gate contact between said first and second regions and insulatively spaced from said surface, a third region formed within one of said first and second regions and abutting said surface, said third region comprising deep level impurities and having a resistance which is higher than the resistance of said one of said first and second regions, and an electrically conductive material on said surface and contacting only said third region.

* * * * *